(12) United States Patent
Conrad

(10) Patent No.: US 11,437,681 B2
(45) Date of Patent: Sep. 6, 2022

(54) ENCLOSURE DEVICE

(71) Applicant: Omachron Intellectual Property Inc., Hampton (CA)

(72) Inventor: Wayne Ernest Conrad, Hampton (CA)

(73) Assignee: Omachron Intellectual Property Inc., Hampton (CA)

( * ) Notice: Subject to any disclaimer, the term of this patent is extended or adjusted under 35 U.S.C. 154(b) by 149 days.

(21) Appl. No.: 16/911,149

(22) Filed: Jun. 24, 2020

(65) Prior Publication Data
US 2020/0411812 A1 Dec. 31, 2020

Related U.S. Application Data

(60) Provisional application No. 62/868,186, filed on Jun. 28, 2019.

(51) Int. Cl.
| | |
|---|---|
| *H01M 50/247* | (2021.01) |
| *H01M 50/20* | (2021.01) |
| *H01M 50/202* | (2021.01) |
| *H01M 50/204* | (2021.01) |
| *H01M 50/262* | (2021.01) |
| *H05K 5/00* | (2006.01) |
| *H05K 5/02* | (2006.01) |

(52) U.S. Cl.
CPC ......... *H01M 50/247* (2021.01); *H01M 50/20* (2021.01); *H01M 50/202* (2021.01); *H01M 50/204* (2021.01); *H01M 50/262* (2021.01); *H05K 5/0004* (2013.01); *H05K 5/0013* (2013.01); *H05K 5/0086* (2013.01); *H05K 5/0221* (2013.01)

(58) Field of Classification Search
None
See application file for complete search history.

(56) References Cited

U.S. PATENT DOCUMENTS

| | | | |
|---|---|---|---|
| 3,676,986 A | 7/1972 | Reiling | |
| 4,018,493 A | 4/1977 | Lyman et al. | |
| 4,079,965 A | 3/1978 | Moughty et al. | |
| 4,345,805 A | 8/1982 | Finley et al. | |
| 4,669,755 A | 6/1987 | Harris et al. | |
| 5,065,878 A * | 11/1991 | Altmann | H02B 1/46 220/3.8 |
| 6,262,366 B1 * | 7/2001 | Ichikawa | H05K 5/0013 174/50 |
| 6,370,730 B1 | 4/2002 | Young et al. | |
| 9,167,944 B2 | 10/2015 | Conrad | |
| 2004/0077390 A1 * | 4/2004 | Liao | G08B 13/1427 455/575.6 |
| 2009/0270136 A1 * | 10/2009 | Su | H01M 50/209 455/572 |
| 2010/0136401 A1 * | 6/2010 | Yang | H01M 50/244 429/100 |
| 2015/0245521 A1 * | 8/2015 | Cheng | H05K 5/03 224/191 |

* cited by examiner

Primary Examiner — Gregg Cantelmo
(74) Attorney, Agent, or Firm — Philip C. Mendes da Costa; Bereskin & Parr LLP/S.E.N.C.R.L., s.r.l.

(57) ABSTRACT

An enclosure defined by first and second halves that are secured together by a locking member that is slidable lockingly engageable therewith.

12 Claims, 5 Drawing Sheets

ENCLOSURE DEVICE

CROSS-REFERENCE TO RELATED APPLICATIONS

This application claims the benefit of the filing date of United Stated Provisional Patent Application No. 62/868,186, filed on Jun. 28, 2019, entitled ENCLOSURE DEVICE, the content of which is incorporated herein by reference.

FIELD

This application relates to molded housings that include an internal chamber for housing a component, such as an electrical housing or a battery pack.

INTRODUCTION

Housings such as for a battery pack are typically assembled from a plurality of molded parts that are then assembled together by screws, rivets or the like. Various types of such housings are known.

SUMMARY

The enclosure comprises first and second halves or portions which, when secured together, define a chamber that may house a component or components, such as an electronics module, batteries or the like. The first and second halves are secured together and optionally releasably secured together, by a locking member that is inserted through an opening in the first half and locking engages an opening provided in an opposed portion of the second half. Accordingly, the enclose may be formed by placing the first and second halves together and then inserting one or more locking members in the first half and inserting them to a position at which they engage and lock to the second half. The locking member extends across the plane at which the halves abut and therefore extends, e. g., transverse or generally transverse to the plane. Accordingly, a force pulling the first and second halves apart is transmitted axially through the locking member.

Optionally, an end portion may be placed on one side of the first and second halves to overlie and enclose the mating edges of the first and second halves. An end portions may be made on more than one side of the first and second halves.

The locking member may be a planar mechanical fastener, which applies force in an axis parallel to the split line of the first and second halves. The locking member may create a smooth surface feature on the front face of the enclosure and a minimal surface relief on the rear face of the enclosure, wherein the minimal relief feature enables the use of a tool to remove the mechanical fastener.

DRAWINGS

For a better understanding of the described embodiments and to show more clearly how they may be carried into effect, reference will now be made, by way of example, to the accompanying drawings in which.

DESCRIPTION OF VARIOUS EMBODIMENTS

Figure 1:
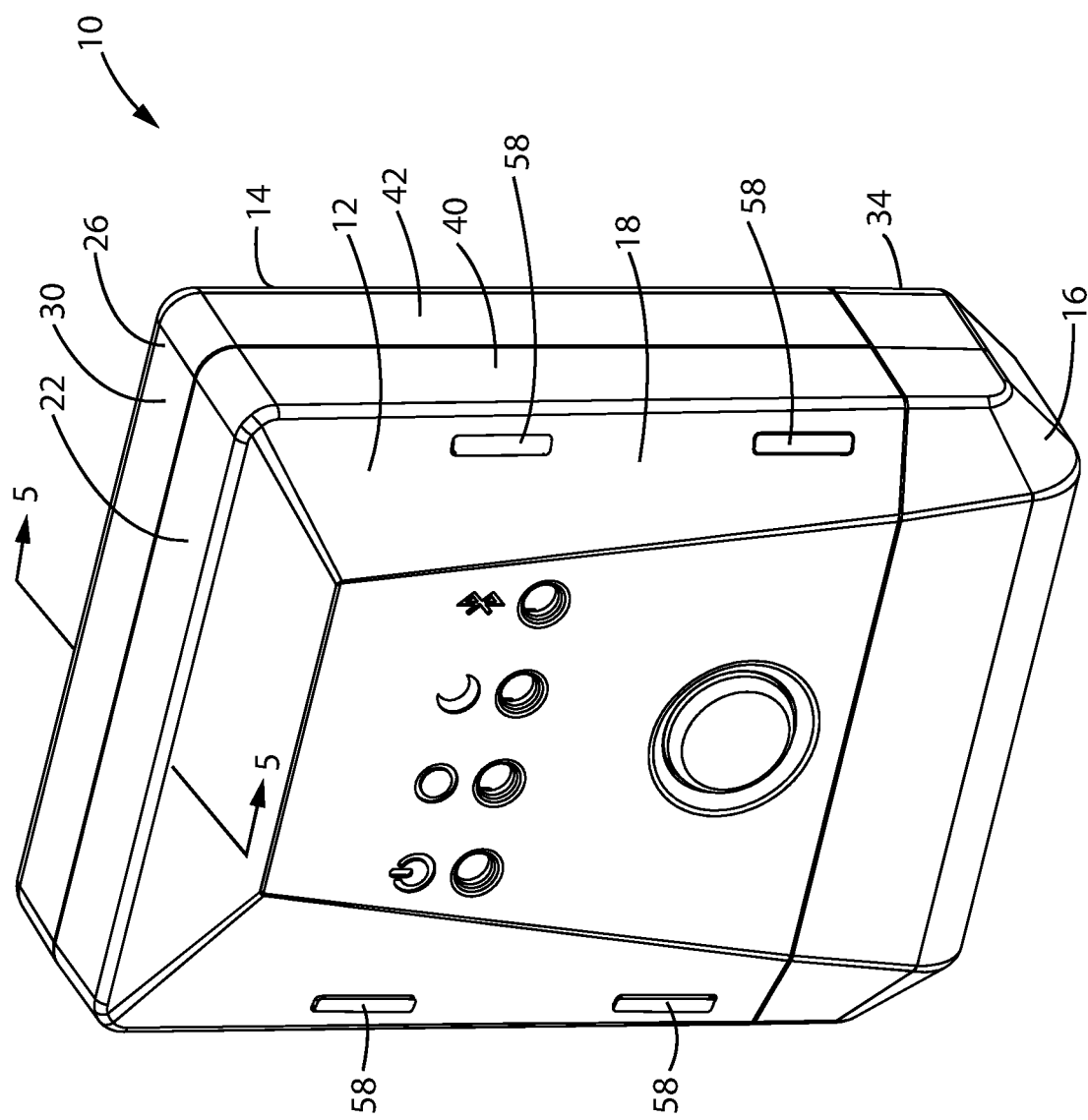
FIG. 1 is a front perspective view of an enclosure in a closed configuration in accordance with one embodiment.
Figure 2:
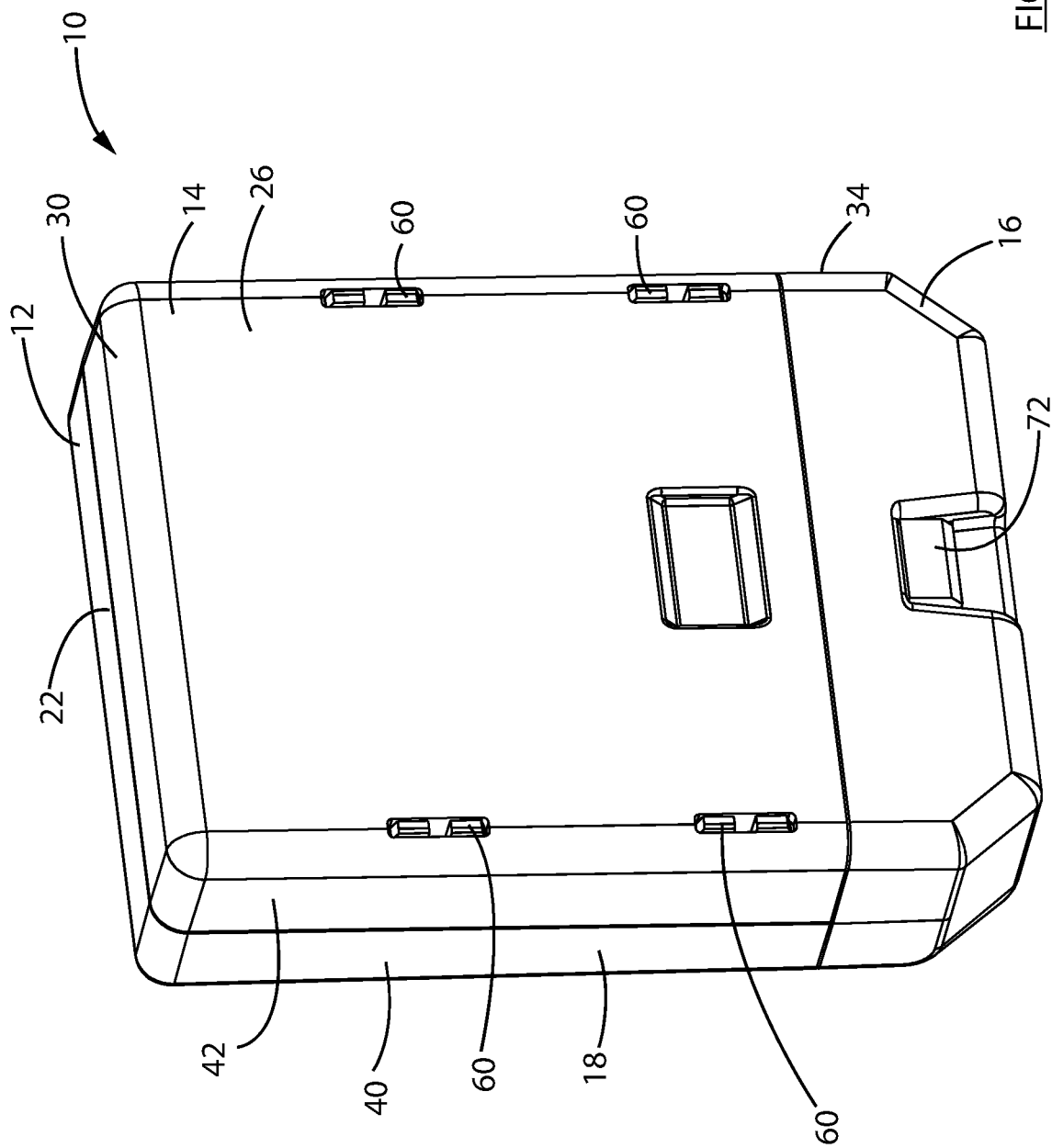
FIG. 2 is a rear perspective view of the enclosure of FIG. 1.
Figure 3:
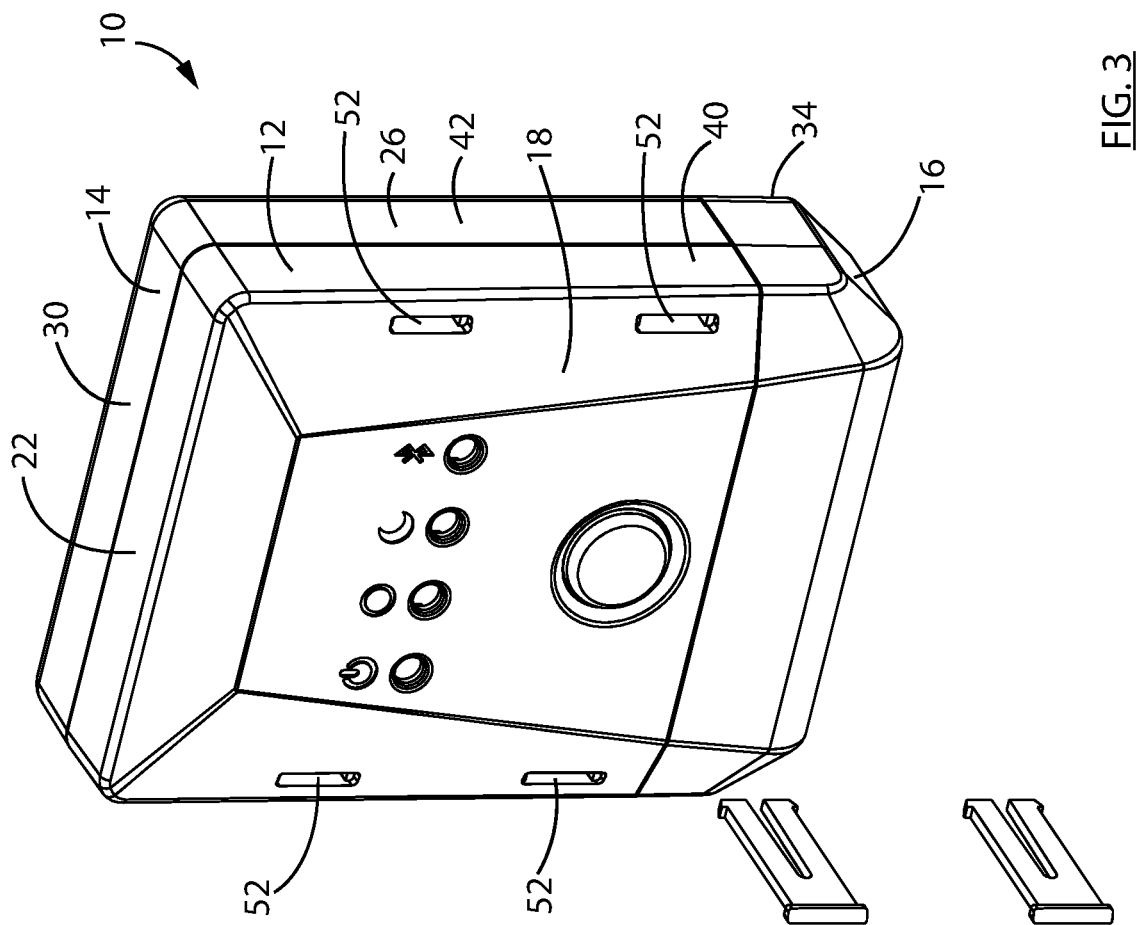
FIG. 3 is a partially exploded front perspective view of the enclosure of FIG. 1.
Figure 3:
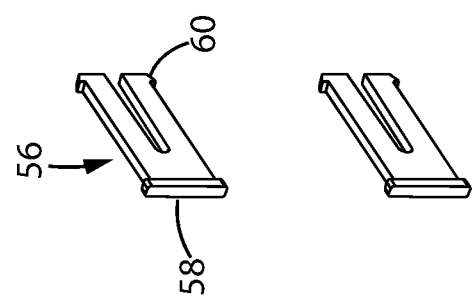

Various apparatuses, methods and compositions are described below to provide an example of an embodiment of each claimed invention. No embodiment described below limits any claimed invention and any claimed invention may cover apparatuses and methods that differ from those described below. The claimed inventions are not limited to apparatuses, methods and compositions having all of the features of any one apparatus, method or composition described below or to features common to multiple or all of the apparatuses, methods or compositions described below. It is possible that an apparatus, method or composition described below is not an embodiment of any claimed invention. Any invention disclosed in an apparatus, method or composition described below that is not claimed in this document may be the subject matter of another protective instrument, for example, a continuing patent application, and the applicant(s), inventor(s) and/or owner(s) do not intend to abandon, disclaim, or dedicate to the public any such invention by its disclosure in this document.

As exemplified in FIGS. 1-5, an enclosure or housing 10 provides a housing having an internal chamber 38. The chamber is defined by first and second housing portions or halves 12, 14. First half 12 has an outer side 18, an inner side 20, a facing panel 44, a top panel 22 a bottom panel 24 and a side panel 40. Similarly, second half 14 has an outer side 26, an inner side 28, a facing panel 46, a top panel 30, a bottom panel 32 and a side panel 42.

As exemplified, enclosure 10 defines a generally rectangular enclosure. It will be appreciated that enclosure 10 may be of any desired shape and may provide an internal chamber 38 of any desired size, which may vary depending upon the components to be placed in chamber 38.

As enclosure 10 is exemplified as generally rectangular, facing panels 44 and 46 are shown as generally planar and the top, side and bottom panels 22, 40, 30, 24, 42 and 32 are generally planar and extend transversely to facing panels 44 and 46. Top, side and bottom panels 22, 40, and 24 of the first half 12 abut top, bottom and side panels 30, 42 and 32 of the second half 14 along abutting edges 48, 50, which define a plane along which the halves 12, 14 abut. In this position, first and second halves 12, 14 define chamber 38.

As exemplified, facing panel 44 of first half 12 is provided with four openings 52 and facing panel 46 of second half 14 has a similar number of openings 54. It will be appreciated that one or more pairs of opposed openings 52, 54 may be provided. A locking member is inserted into an opening 52 and is received in, and secured to, a second opening. As exemplified in FIG. 4, a locking member has a first end 58 and a second, locking end 60.

As exemplified in FIG. 1, first end 58 may seat in enclosure 10 so as to be flush with outer side 18 of first half 12. An advantage of this design is that there is no portion of locking member 56 which a person may access to try to pull the locking member 56 outwardly so as to open enclosure 10. It will be appreciated that, in some embodiments, first end 58 need not seat flush with outer side 18 of first half 12.

Figure 4:
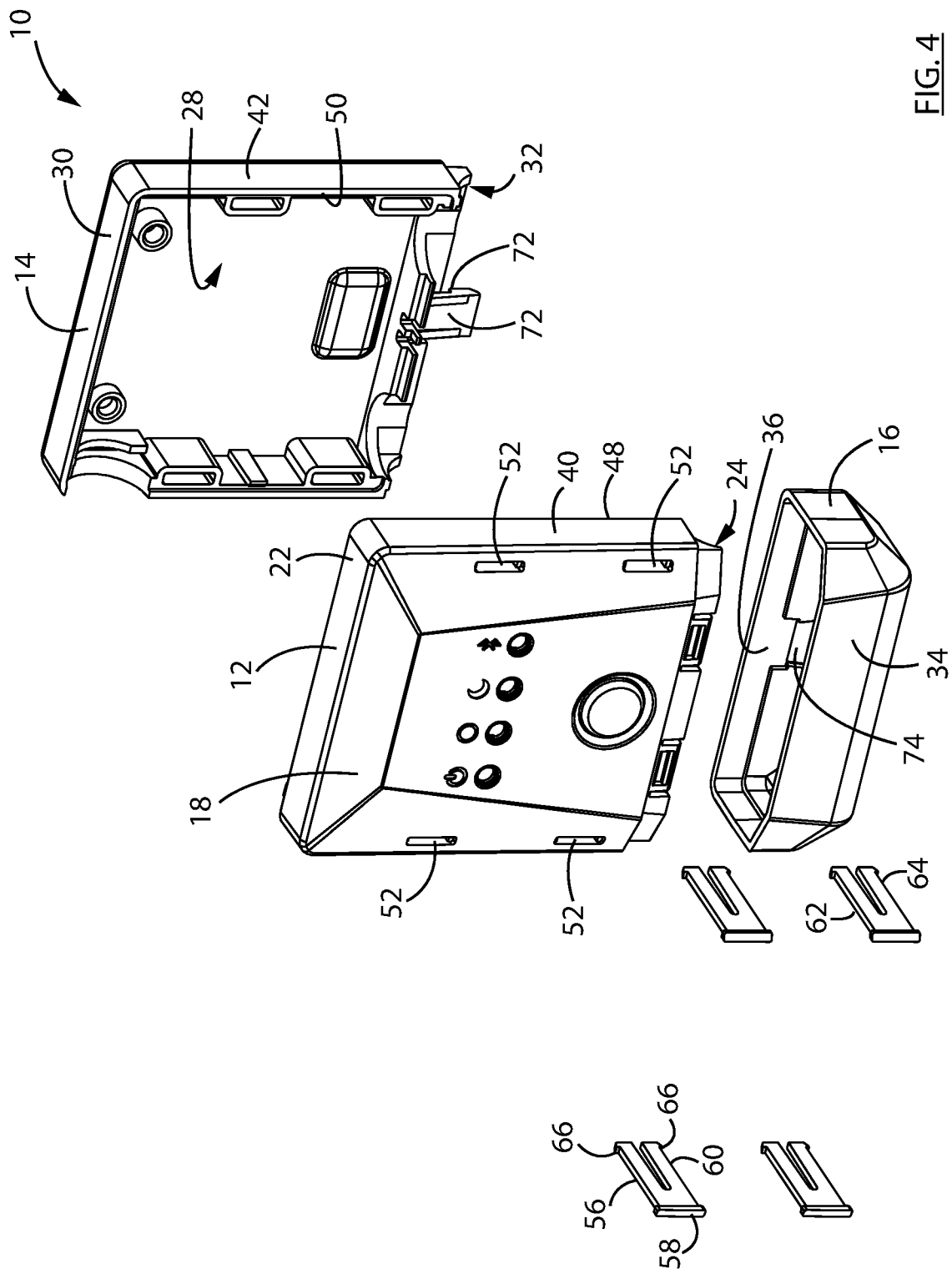
FIG. 4 is an exploded front perspective view of the enclosure of FIG. 1.

Second end 60 of locking member may be configured to slideably locking engage second half 14. According, as second end 60 of locking member 56 is inserted into opening 54 of second half 14, second end 60 and the housing around opening 54 may inter-engage so as to lock or secure the locking member 56 in position. Referring to FIG. 4, the second end 60 is provided with first and second forked legs 62, 64 that are in the locked position or configuration shown in FIG. 5. The first and second forked legs 62, 64 are compressed towards each other as the locking member is inserted into opening 54 of the second half 14.

The legs may be biased to the locked position by any means, such as the legs being made of a resilient or pliant material that will enable the legs being compressed towards each other as the locking member is inserted into opening 54 of the second half 14. Alternately, or in addition, a spring member of the like may be used.

Figure 5:
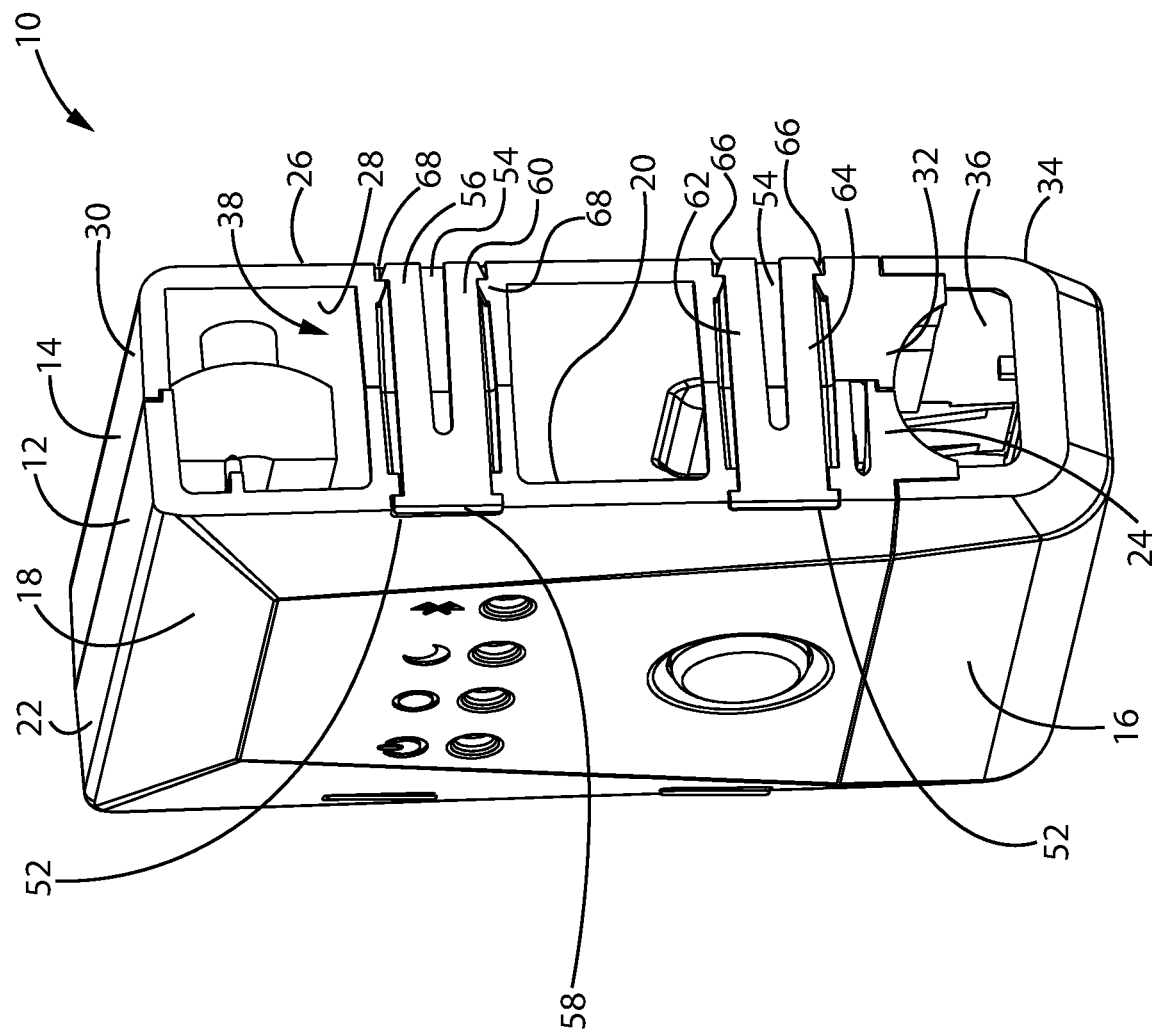
FIG. 5 is a cross-section along the line 5-5 in FIG. 1.

In order to secure, or assist in securing, the locking member 56 in the inserted position shown in FIG. 5, locking member 56 and second half 14 may have abutment or engagement members that inhibit the removal of locking member out of opening 54. As exemplified in FIGS. 4 and 5, legs 62, 64 are provided with a flange or protrusion (abutment or engagement member) 66 and opening 54 is provided with a mating flange or protrusion (abutment or engagement member) 68. As locking member is inserted into opening 54, legs 62, 64 may be compressed together into an insertion position or configuration. As the end of the legs pass by the protrusion 68, legs 62, 64 are compressed together (or further compressed together). Once past the protrusion 68, legs 62, 64 may move apart. Engagement between abutting members 66, 68 inhibits, or may prevent, withdrawal of the locking member 56 from opening 54. Accordingly, the first and second halves 12, 14 may be secured together. Further, engagement between first end 58 of locking member 56 and the housing surrounding opening 52 will inhibit or prevent the first end 52 of locking member 56 from being pushed through opening 52, which would result in the enclosure being opened. It will be appreciated that the second end of locking member 60 may be of other designs known in the art which use a compression type fit. It will be appreciated that the legs 62, 64 may be moved towards each other so as to enable locking member to be removed. Accordingly, engagement members 66, 68 may be releasably engageable.

An optional end portion 16 may be provided on one or more of the sides of the enclosure 10. End portion may overlie the side such that one of the top, bottom or side panels of the first and second halves are contained within the end portion 16.

End portion 16 may be secured in position by any means. As exemplified, a mechanical fastener is used. Referring to FIG. 4, first half 12 is provided with a flange 70 having an abutment member 72. End portion 16 is provided with an opening 74. When end portion 16 is slid onto the enclosure 10, flange 70 is received in end portion 16 and, when end portion 16 is in the closed position shown in FIG. 1, abutment member 72 of flange 70 will extend into opening 74 of end portion 16 and may snap into the locked position. Engagement between the hosing surrounding opening 74 and the abutment member 72 of flange 70 will inhibit, and may prevent, end portion 16 being removed from the first and second halve 12, 14.

Flange 70 may be biased to the locked position by the flange being made of a resilient or pliant material and be in the locked position when no force is applied thereto. Alternately, or in addition, a biasing member such as a spring may be provided.

Optionally, end member 16 may be removable mounted. For example, a user may press inwardly on flange 70 (e.g., the portion that is visible in FIG. 2). This may enable the abutment member 72 moving to a non-abutting position, thereby allowing end portion to be slid downwardly off first and second halves 12, 14.

While the above description describes features of example embodiments, it will be appreciated that some features and/or functions of the described embodiments are susceptible to modification without departing from the spirit and principles of operation of the described embodiments. For example, the various characteristics which are described by means of the represented embodiments or examples may be selectively combined with each other. Accordingly, what has been described above is intended to be illustrative of the claimed concept and non-limiting. It will be understood by persons skilled in the art that other variants and modifications may be made without departing from the scope of the invention as defined in the claims appended hereto. The scope of the claims should not be limited by the preferred embodiments and examples, but should be given the broadest interpretation consistent with the description as a whole.

The invention claimed is:

1. A housing comprising:
   (a) a first housing portion having an outer side, an inner side and a plurality of first openings, each first opening having a recess;
   (b) a second housing portion having an outer side, an inner side, and a plurality of second openings, each second opening having a first engagement member wherein, the first and second housing portions being positionable in a closed configuration in which inner side of the first housing portion faces the inner side of the second housing portion, and, in the closed configuration, the first and second housing portions define an interior chamber and the first and second openings are aligned and define pairs of opposed openings; and,
   (c) a plurality of locking members, each locking member having a longitudinally extending planar body with a first end and an opposed second end having a second engagement member, wherein a longitudinal axis extends between the first end and the opposed second end, the second engagement member comprises a pair of forked legs, the forked legs are moveable between an insertion configuration and a locked configuration, the forked legs are biased to the locked configuration and are moveable in a plane that is transverse to the longitudinal axis,
   wherein, when the first and second housing portions are in the closed configuration, the second end of a first locking member is slideably insertable through the first opening of a first pair of opposed openings and is lockingly receivable in the second opening of the first pair of openings.

2. The housing of claim 1 wherein the first and second engagement members are releasably engageable.

3. The housing of claim 1 wherein the second engagement member transitions to the insertion configuration upon passing through the second opening and transitions to the locked configuration after passing through the second opening.

4. The housing of claim 3 wherein the forked legs are made of a pliant material.

5. The housing of claim 1 wherein the forked legs are made of a pliant material.

6. The housing of claim 1 wherein, when the first locking member is lockingly inserted into the first pair of openings, the first end of the first locking member is positioned in the recess.

7. The housing of claim 1 wherein, when the first locking member is lockingly inserted into the first pair of openings, the first end of the first locking member is flush with the outer side of the first housing portion.

8. The housing of claim 1 wherein the housing is a battery housing.

9. The housing of claim 1 wherein the second opening is accessible from an outer side of the second housing portion and, when the first and second housing portions are in secured together by the locking members, the second ends of the locking members are accessible, whereby the locking members may be moved to the insertion configuration.

10. A housing comprising first and second opposed halves and an end portion, the first and second opposed halves, when abutting, provide an internal cavity, each of the first and second opposed halves having at least one pair of opposed openings, and a locking member that is slideable insertable into the first and second openings in a longitudinal direction wherein a first end of the locking member abuts the first opposed half in a locked position and a distally positioned locking end of the locking member locking engages with the second opposed half when the locking member is in the locked position, the first and second opposed halves have a first end and a second opposed end, the first and second ends are spaced apart in a plane that is transverse to the longitudinal direction, the second opposed ends of the first and second opposed halves are slidably insertable in a transverse direction into the end portion and are lockingly securable thereto.

11. The housing of claim 10 wherein the locking member comprises a longitudinally extending planar body and the distally positioned locking end of the locking member comprises a pair of forked legs, the forked legs are moveable between an insertion configuration and a locked configuration, the forked legs are biased to the locked configuration and are moveable in a plane that is transverse to the longitudinal direction.

12. The housing of claim 11 wherein the forked legs are made of a pliant material.

\* \* \* \* \*